(12) United States Patent
Mori et al.

(10) Patent No.: US 11,219,946 B2
(45) Date of Patent: Jan. 11, 2022

(54) FIRING MATERIAL COMPOSITION, METHOD FOR MANUFACTURING FILM-SHAPED FIRING MATERIAL, AND METHOD FOR MANUFACTURING FILM-SHAPED FIRING MATERIAL WITH SUPPORT SHEET

(71) Applicant: LINTEC Corporation, Tokyo (JP)

(72) Inventors: Takeshi Mori, Tokyo (JP); Hidekazu Nakayama, Tokyo (JP); Isao Ichikawa, Tokyo (JP); Yukiharu Nose, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 16/650,225

(22) PCT Filed: Sep. 28, 2018

(86) PCT No.: PCT/JP2018/036356
§ 371 (c)(1),
(2) Date: Mar. 24, 2020

(87) PCT Pub. No.: WO2019/069818
PCT Pub. Date: Apr. 11, 2019

(65) Prior Publication Data
US 2020/0273596 A1      Aug. 27, 2020

(30) Foreign Application Priority Data
Oct. 2, 2017 (JP) .............................. JP2017-192820

(51) Int. Cl.
*B22F 1/00* (2006.01)
*H01B 1/22* (2006.01)
(Continued)

(52) U.S. Cl.
CPC .......... *B22F 1/0059* (2013.01); *B22F 1/0022* (2013.01); *B22F 1/0062* (2013.01);
(Continued)

(58) Field of Classification Search
None
See application file for complete search history.

(56) References Cited

U.S. PATENT DOCUMENTS

| 7,410,601 B2 | 8/2008 | Sato et al. | |
| 2004/0084131 A1* | 5/2004 | Konoue | B32B 18/00 156/89.11 |

(Continued)

FOREIGN PATENT DOCUMENTS

| CN | 102326460 A | 1/2012 |
| CN | 102651248 A | 8/2012 |

(Continued)

OTHER PUBLICATIONS

Dowanol DPM Technical Data Sheet, The Dow Chemical Company, Form No. 110-00618-0812, published 2012; available online, copy attached as PDF pp. 1-3. (Year: 2012).*

(Continued)

*Primary Examiner* — Katie L. Hammer
(74) *Attorney, Agent, or Firm* — Nixon & Vanderhye P.C.

(57) ABSTRACT

The present invention provides a film-shaped firing composition with excellent printability, a method of producing a film-shaped firing material obtained by using the firing material composition, and a method of producing a film-shaped firing material with a support sheet. A paste-like firing material composition is provided, including sinterable metal particles (10), a binder component (20), and a solvent having a relative evaporation rate of 4.0 or less with respect to butyl acetate, in which a content of the solvent is in a
(Continued)

range of 12% to 50% by mass with respect to a total mass of the firing material composition.

6 Claims, 2 Drawing Sheets

(51) Int. Cl.
  *H01L 21/52* (2006.01)
  *B22F 7/08* (2006.01)
  *H01R 11/01* (2006.01)
  *H01B 1/02* (2006.01)
(52) U.S. Cl.
  CPC .............. *B22F 1/0074* (2013.01); *B22F 7/08* (2013.01); *H01B 1/02* (2013.01); *H01B 1/22* (2013.01); *H01L 21/52* (2013.01); *H01R 11/01* (2013.01); *B22F 2001/0092* (2013.01); *B22F 2999/00* (2013.01)

(56) References Cited

U.S. PATENT DOCUMENTS

| | | | |
|---|---|---|---|
| 2006/0192180 A1* | 8/2006 | Ichitani | C03C 3/072 252/500 |
| 2010/0189901 A1 | 7/2010 | Chung et al. | |
| 2014/0048749 A1* | 2/2014 | Lockett | C09D 11/52 252/512 |
| 2014/0124713 A1* | 5/2014 | Majumdar | H01L 29/45 252/513 |
| 2014/0186596 A1* | 7/2014 | Shipway | C09D 11/322 428/209 |
| 2016/0288213 A1 | 10/2016 | Kumaki et al. | |
| 2017/0306172 A1 | 10/2017 | Koduma | |
| 2018/0147673 A1 | 5/2018 | Schmitt et al. | |

FOREIGN PATENT DOCUMENTS

| | | |
|---|---|---|
| CN | 102687256 A | 9/2012 |
| CN | 103170618 A | 6/2013 |
| CN | 103597547 A | 2/2014 |
| CN | 104494239 A | 4/2015 |
| CN | 104588643 A | 5/2015 |
| CN | 104778990 A | 7/2015 |
| CN | 107211537 A | 9/2017 |
| EP | 2 946 856 A1 | 11/2015 |
| EP | 3 358 607 | 8/2018 |
| JP | 2010-500475 | 1/2010 |
| JP | 2011-252140 | 12/2011 |
| JP | 2013-185213 | 9/2013 |
| JP | 2014-111800 | 6/2014 |
| JP | 2016-121329 | 7/2016 |
| JP | 2016-135916 | 7/2016 |
| JP | 2016-189443 | 11/2016 |
| JP | 2016-219202 | 12/2016 |
| JP | 2017-066384 | 4/2017 |
| JP | 2017-123253 | 7/2017 |
| KR | 10-2013-0018619 A | 2/2013 |
| WO | WO 2015/152625 A1 | 10/2015 |
| WO | 2016/052033 | 4/2016 |
| WO | 2016/052036 | 4/2016 |
| WO | WO 2016/194289 A1 | 8/2016 |
| WO | 2017/036704 | 3/2017 |

OTHER PUBLICATIONS

International Search Report for PCT/JP2018/036356, dated Dec. 4, 2018, 4 pages.
Kyowa Kako Co., Ltd., List of solvent components [online], Jul. 17, 2009, retrieval date Nov. 16, 2018, internet: http://www.kyowakako.com/pdf/list_of_solA4.pdf, 1 page.
Extended European Search Report dated Feb. 10, 2021 in European Application No. 18864479.3, 13 pages.
Chinese Office Action dated Aug. 3, 2021 in Chinese Application No. 201880063998.6 with English translation, 17 pages.
Korean Notice of Allowance dated Sep. 16, 2021 in Korean Application No. 10-2020-7008741 with English translation, 4 pages.

* cited by examiner

FIRING MATERIAL COMPOSITION, METHOD FOR MANUFACTURING FILM-SHAPED FIRING MATERIAL, AND METHOD FOR MANUFACTURING FILM-SHAPED FIRING MATERIAL WITH SUPPORT SHEET

TECHNICAL FIELD

The present invention relates to a firing material composition, a method of producing a film-shaped firing material, and a method of producing a film-shaped firing material with a support sheet.

This application is the U.S. national phase of International Application No. PCT/JP2018/036356 filed 28 Sep. 2018, which designated the U.S. and claims priority to Japanese Patent Application No. 2017-192820, filed on Oct. 2, 2017, the entire contents of each of which are incorporated herein by reference.

BACKGROUND ART

In recent years, with the high voltage and high current of automobiles, air conditioners, and personal computers, the demand for power semiconductor elements (power devices) to be mounted on these has increased. Since a power semiconductor element is used in a high-voltage and high-current environment, generation of heat from the semiconductor element may become a problem.

In the related art, a heat sink is attached to the periphery of a semiconductor element in some cases for the purpose of heat dissipation of heat generated from the semiconductor element. However, in a case where the thermal conductivity in a portion where the heat sink and the semiconductor element are bonded is not excellent, efficient heat dissipation is affected.

As a bonding material with excellent thermal conductivity, for example, Patent Document 1 discloses a paste-like metal fine particle composition in which specific heat-sinterable metal particles, a specific polymer dispersant, and a specific volatile dispersion medium are mixed. It is considered that a solid metal with excellent thermal conductivity is obtained in a case where the composition is sintered.

However, in a case where a firing material is in the form of a paste as described in Patent Document 1, the thickness of the paste to be applied is unlikely to be uniform, and the thickness stability tends to be poor.

For this reason, as a film-shaped firing material, for example, Patent Document 2 discloses a sheet for heat bonding which includes 60% to 98% by mass of metal fine particles, has a tensile elasticity of 10 to 3000 MPa, and has a carbon concentration of 15% by mass or less that is obtained by energy dispersive X-ray analysis after being heated to 400° C. in an air atmosphere.

CITATION LIST

Patent Literature

[Patent Document 1] Japanese Unexamined Patent Application, First Publication No. 2014-111800
[Patent Document 2] Japanese Unexamined Patent Application, First Publication No. 2016-121329

DISCLOSURE OF INVENTION

Technical Problem

Conventionally, a firing material is used for sinter bonding of a substrate and chips which have been divided by dicing a semiconductor wafer or the like. A paste-like firing material is not particularly problematic because the paste-like firing material is used by being directly applied to an object to be sinter-bonded. However, in a case where the shape of a film-shaped firing material is intended to match the shape of the object to be sinter-bonded, typically, a film-shaped firing material having a large area is produced and then punched into a desired shape.

However, a large amount of scraps are generated depending on the punched shape, and the scraps need to be disposed of. Therefore, the yield of the firing material with respect to the raw material decreases. At the same time, this leads to a steep rise in prices of products. Particularly, since a semiconductor wafer has a circular shape, scraps are likely to be generated in a case where a film-shaped firing material is cut into a circular shape according to the shape of a semiconductor wafer. Further, even in a case where the film-shaped firing material is used without being punched, the portion that is not in contact with the object to be sinter-bonded is disposed of. As described above, in a case where a film-shaped firing material is used, a problem of waste loss occurs.

Therefore, the present inventors considered producing a film-shaped firing material by performing screen printing such that the shape of the firing material matches the shape of an object to be sinter-bonded such as a semiconductor wafer, in order to solve the problem of waste loss.

In the screen printing, first, a paste material is added dropwise onto a screen plate on which an image pattern has been formed, and an opening portion of the screen plate is filled with the paste material using a scraper. Next, the image pattern is transferred to a support by extruding the paste material from the opening portion of the screen plate using a squeegee and scraping the excess paste material while bringing the material into close contact with the support (subject).

However, a paste-like firing material of the related art does not necessarily have satisfactory printability. Therefore, in a case where the paste-like firing material of the related art is intended to be applied to screen printing, plate separation is poor, and thus the transfer may become insufficient or the shape of the transferred material may be lost before the transferred material on the support is dried.

The present invention has been made in consideration of the above-described circumstances, and an object thereof is to provide a firing material composition with excellent printability. Further, another object thereof is to provide a method of producing a film-shaped firing material obtained by using the firing material composition and a method of producing a film-shaped firing material with a support sheet.

Solution to Problem

The present invention includes the following aspects.

[1] A paste-like firing material composition, including: sinterable metal particles; a binder component; and a solvent having a relative evaporation rate of 4.0 or less with respect to butyl acetate, in which a content of the solvent is in a range of 12% to 50% by mass with respect to a total mass of the firing material composition.

[2] The firing material composition according to [1], in which a viscosity of the firing material composition which is measured at a temperature of 23° C. and a shear rate of 1 $\sec^{-1}$ is in a range of 10 to 1000 Pa·s, and a viscosity thereof which is measured at a temperature of 23° C. and a shear rate of 1000 $\sec^{-1}$ is in a range of 1 to 10 Pa·s.

[3] A method of producing a film-shaped firing material, including: a step of screen-printing the firing material composition according to [1] or [2] on a support.

[4] The method of producing a film-shaped firing material according to [3], in which a contact angle between the firing material composition and the support is in a range of 20° to 60°.

[5] The method of producing a film-shaped firing material according to [3] or [4], in which the firing material composition is screen-printed in a circular shape.

[6] The method of producing a film-shaped firing material according to [5], in which an area of the film-shaped firing material is in a range of 3.5 to 1600 cm$^2$, and a thickness thereof is in a range of 10 to 200 μm.

[7] A method of producing a film-shaped firing material with a support sheet, including: a step of providing a film-shaped firing material on a support sheet after the film-shaped firing material is obtained according to the method of producing a film-shaped firing material according to any one of [3] to [6].

Advantageous Effects of Invention

According to the present invention, it is possible to provide a firing material composition with excellent printability. Further, it is also possible to provide a method of producing a film-shaped firing material obtained by using the firing material composition and a method of producing a film-shaped firing material with a support sheet.

BEST MODE FOR CARRYING OUT THE INVENTION

Figure 1:
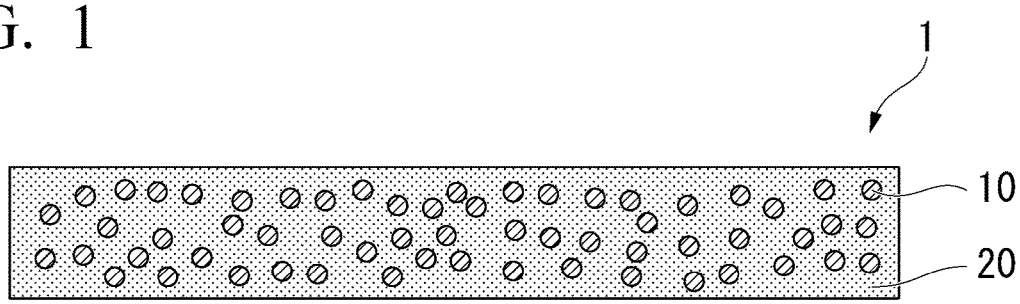
FIG. 1 is a cross-sectional view schematically illustrating an embodiment of a film-shaped firing material obtained by the present invention.

Hereinafter, embodiments of the present invention will be appropriately described with reference to the accompanying drawings.

Further, the drawings used in the description below are shown by enlarging main portions for convenience in order to facilitate understanding of the features of the present invention, and the dimensional ratio and the like of each constituent element are not necessarily the same as the actual ratio.

<<Firing Material Composition>>

A firing material composition according to the present embodiment is in the form of a paste and contains sinterable metal particles, a binder component, and a solvent having a relative evaporation rate of 4.0 or less with respect to butyl acetate, <Sinterable Metal Particles>

The sinterable metal particles are metal particles which can be fused and bonded to form a sintered body by being subjected to a heat treatment at a temperature of the melting point of the metal particles or higher as firing of the film-shaped firing material obtained by screen-printing the firing material composition. The formation of the sintered body enables sinter bonding of the film-shaped firing material and a fired product in contact with the film-shaped firing material. Specifically, the chips and the substrate can be sinter-bonded through the film-shaped firing material.

Examples of the metal species of the sinterable metal particles include silver, gold, copper, iron, nickel, aluminum, silicon, palladium, platinum, titanium, barium titanate, and oxides or alloys of these. Among these, silver and silver oxide are preferable. Only one kind of metal or a combination of two or more kinds of metals may be blended into the sinterable metal particles.

It is preferable that the sinterable metal particles be silver nanoparticles having a particle diameter of 100 nm or less, preferably 50 nm or less, and more preferably 20 nm or less.

The particle diameter of the sinterable metal particles contained in the firing material composition is not particularly limited as long as sinterability can be exhibited, but may be 100 nm or less, 50 nm or less, or 30 nm or less. For example, it is preferable that the content of sinterable metal particles having a particle diameter of 100 nm or less be 20% by mass or greater with respect to the total amount of the entire particles. Further, the particle diameter of the sinterable metal particles contained in the firing material composition is set as a projected area circle equivalent diameter of the particle diameter of the sinterable metal particles observed using an electron microscope.

The sinterable metal particles with the particle diameter in the above-described range are preferable from the viewpoint of excellent sinterability.

In the particle diameter of the sinterable metal particles contained in the firing material composition, the number average of the particle diameters acquired using particles whose projected area circle equivalent diameters of the particle diameters of the sinterable metal particles observed using an electron microscope are 100 nm or less may be in a range of 0.1 to 95 nm, in a range of 0.3 to 50 nm, or in a range of 0.5 to 30 nm. Further, the number of sinterable metal particles to be measured is set to 100 or more, for example, 100 particles randomly selected per one film-shaped firing material.

Since the sinterable metal particles are set to be in a state in which aggregates are eliminated in advance before the sinterable metal particles are mixed with binder components, solvents, and the like, the sinterable metal particles may be dispersed in a high-boiling-point solvent having a high boiling point such as isobornyl cyclohexanol or decyl alcohol. The boiling point of the high-boiling-point solvent may be, for example, in a range of 200° C. to 350° C. At this time, in a case where the high-boiling-point solvent is used, since the solvent is unlikely to volatilize at room temperature, an increase in concentration of the sinterable metal particles is prevented, the workability is improved, and the re-aggregation and the like of the sinterable metal particles are also prevented so that the quality thereof becomes satisfactory. As the dispersion method, the dispersion may be carried out using a kneader, a triple roll, a bead mill, or ultrasonic waves.

Metal particles (sinterable metal particles) having a particle diameter of 100 nm or less and non-sinterable metal particles having a particle diameter of greater than 100 nm that do not correspond to the metal particles may further be blended into the firing material composition according to the present embodiment. Further, the particle diameter of the non-sinterable metal particles is set as a projected area circle equivalent diameter of the particle diameter of the non-sinterable metal particles observed using an electron microscope. The particle diameter of the non-sinterable metal particles may be, for example, greater than 100 nm and less than or equal to 5000 nm, and it is preferable that the content thereof having a particle diameter of 100 nm to 2500 nm be 5% by mass or greater with respect to the total amount of the entire particles. In the particle diameter of the non-sinterable metal particles having a particle diameter of greater than 100 nm, the number average of the particle diameters acquired using particles whose projected area circle equivalent diameters of the particle diameters of the non-sinterable metal particles observed using an electron microscope are greater than 100 nm may be greater than 150 nm and 50000 nm or less, in a range of 150 to 10000 nm, or in a range of 180 to 5000 nm.

Examples of the metal species of the non-sinterable metal particles having a particle diameter of greater than 100 nm are the same as those exemplified as the metal species of the sinterable metal particles. Among these, silver, copper, and oxides of these are preferable.

The sinterable metal particles having a particle diameter of 100 nm or less and the non-sinterable metal particles having a particle diameter of greater than 100 nm may be the metal species which are the same as or different from each other. For example, the sinterable metal particles having a particle diameter of 100 nm or less may be silver particles and the non-sinterable metal particles having a particle diameter of greater than 100 nm may be silver particles or silver oxide particles. For example, the sinterable metal particles having a particle diameter of 100 nm or less may be silver particles or silver oxide particles and the non-sinterable metal particles having a particle diameter of greater than 100 nm may be copper particles or copper oxide particles.

In the firing material composition according to the present embodiment, the content of the sinterable metal particles may be in a range of 10% to 100% by mass or may be in a range of 20% to 95% by mass with respect to the total mass (100% by mass) of all metal particles.

The surface of the sinterable metal particle and/or the surface of the non-sinterable metal particle may be coated with an organic substance. In a case where the film-shaped firing material has a film coated with an organic substance, the compatibility with a binder component is improved. Further, aggregation of particles can be prevented, and the particles can be uniformly dispersed.

In a case where the surface of the sinterable metal particle and/or the surface of the non-sinterable metal particle is coated with an organic substance, the mass of the sinterable metal particle and the non-sinterable metal particle is set as a value of the mass including the coated substance.

<Binder Component>

In a case where a binder component is blended into the film-shaped firing material, the firing material can be molded in a film shape, and tackiness can be imparted to the film-shaped firing material before being fired. The binder component may be thermally decomposable, that is, thermally decomposed by being subjected to a heat treatment as firing of the film-shaped firing material.

The binder component is not particularly limited, and suitable examples of the binder component include resins. Examples of the resins include an acrylic resin, a polycarbonate resin, polylactic acid, and a polymer of a cellulose derivative. Among these, an acrylic resin is preferable. The acrylic resin includes a homopolymer of a (meth)acrylate compound, two or more copolymers of a (meth)acrylate compound, and a copolymer of a (meth)acrylate compound and another copolymer monomer.

The content of the constituent unit derived from the (meth)acrylate compound in the resin constituting the binder component is preferably in a range of 50% to 100% by mass, more preferably in a range of 80% to 100% by mass, and still more preferably in a range of 90% to 100% by mass with respect to the total mass (100% by mass) of the constituent units.

Here, the term "derived" means that the monomer has undergone a structural change necessary for polymerization.

Specific examples of the (meth)acrylate compound include alkyl (meth)acrylate such as methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, pentyl (meth)acrylate, amyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, or isostearyl (meth)acrylate;

hydroxyalkyl (meth)acrylate such as hydroxyethyl (meth)acrylate, 2-hydroxypropyl (meth)acrylate, 4-hydroxybutyl (meth)acrylate, 3-hydroxypropyl (meth)acrylate, 2-hydroxybutyl (meth)acrylate or 3-hydroxybutyl (meth)acrylate;

phenoxyalkyl (meth)acrylate such as phenoxyethyl (meth)acrylate, 2-hydroxy-3-phenoxypropyl (meth)acrylate;

alkoxyalkyl (meth)acrylate such as 2-methoxyethyl (meth)acrylate, 2-ethoxyethyl (meth)acrylate, 2-propoxyethyl (meth)acrylate, 2-butoxyethyl (meth)acrylate, or 2-methoxybutyl (meth)acrylate;

polyalkylene glycol (meth)acrylate such as polyethylene glycol mono(meth)acrylate, ethoxy diethylene glycol (meth)acrylate, methoxy polyethylene glycol (meth)acrylate, phenoxy polyethylene glycol (meth)acrylate, nonyl phenoxy polyethylene glycol (meth)acrylate, polypropylene glycol mono(meth)acrylate, methoxy polypropylene glycol (meth)acrylate, ethoxy polypropylene glycol (meth)acrylate, or nonyl phenoxy polypropylene glycol (meth)acrylate;

cycloalkyl (meth)acrylate such as cyclohexyl (meth)acrylate, 4-butyl cyclohexyl (meth)acrylate, dicyclopentanyl (meth)acrylate, dicyclopentenyl (meth)acrylate, dicyclopentadienyl (meth)acrylate, bornyl (meth)acrylate, isobornyl (meth)acrylate, or tricyclodecanyl (meth)acrylate; and benzyl (meth)acrylate, and tetrahydrofurfuryl (meth)acrylate. Among these, alkyl (meth)acrylate or alkoxyalkyl (meth)acrylate is preferable. As a particularly preferable (meth)acrylate compound, butyl (meth)acrylate, ethylhexyl (meth)acrylate, lauryl (meth)acrylate, isodecyl (meth)acrylate, 2-ethylhexyl (meth)acrylate, and 2-ethoxyethyl (meth) acrylate are exemplified.

In the present specification, "(meth)acrylate" includes both of "acrylate" and "methacrylate".

As an acrylic resin, methacrylate is preferable. In a case where the binder component has a constituent unit derived from methacrylate, the film-shaped firing material can be fired at a relatively low temperature, and the conditions for sufficiently obtaining the adhesive strength after the material is sintered can be easily satisfied.

The content of the constituent unit derived from methacrylate in the resin constituting the binder component is preferably in a range of 50% to 100% by mass, more preferably in a range of 80% to 100% by mass, and still more preferably in a range of 90% to 100% by mass with respect to the total mass (100% by mass) of the constituent units.

Another copolymer monomer is not particularly limited as long as the compound can be copolymerized with the (meth)acrylate compound, and examples thereof include unsaturated carboxylic acids such as (meth)acrylic acid, vinyl benzoic acid, maleic acid, and vinyl phthalic acid; and a vinyl group-containing radically polymerizable compound such as vinyl benzyl methyl ether, vinyl glycidyl ether, styrene, α-methylstyrene, butadiene, or isoprene.

The mass-average molecular weight (Mw) of the resin constituting the binder component is preferably in a range of 1000 to 1000000 and more preferably in a range of 10000 to 800000. In a case where the mass-average molecular weight of the resin is in the above-described range, the film exhibits sufficient film hardness, and the flexibility can be easily imparted to the film.

In the present specification, the "mass-average molecular weight" is a value in terms of polystyrene which is measured according to the gel permeation chromatography (GPC) method unless otherwise specified.

The glass transition temperature (Tg) of the resin constituting the binder component is preferably in a range of −60° C. to 50° C., more preferably in a range of −30° C. to 10° C., and still more preferably −20° C. or higher and lower than 0° C. In a case where the Tg of the resin is lower than or equal to the above-described upper limit, the adhesive force before the firing between the film-shaped firing material and the adherend is improved. In addition, the flexibility of the film-shaped firing material is improved. Further, in a case where the Tg of the resin is higher than or equal to the above-described lower limit, the film shape can be maintained, and the film-shaped firing material is more easily pulled apart from the support sheet or the like.

In the present specification, "the glass transition temperature (Tg)" is a temperature of an inflection point of a DSC curve obtained by measuring the DSC curve of a sample using a differential scanning calorimeter.

The binder component may be thermally decomposable, that is, thermally decomposed by being subjected to a heat treatment as firing of the film-shaped firing material. The thermal decomposition of the binder component can be confirmed from a decrease in mass of the binder component due to firing. Further, a component to be blended as the binder component may be almost thermally decomposed due to firing, but the entire component to be blended as the binder component may not be thermally decomposed due to firing.

The mass of the binder component after being fired may be 10% by mass or less, 5% by mass or less, 3% by mass or less, or 0% by mass with respect to the total mass (100% by mass) of the binder component before being fired.

<Solvent>

A solvent (hereinafter, noted as a "solvent (A)") having a relative evaporation rate of 4.0 or less with respect to butyl acetate is unlikely to be evaporated during a time period from dropwise addition of the firing material composition on a screen plate to the scraping of the excess firing material composition using a squeegee at the time of screen-printing of the firing material composition. Accordingly, the excess firing material composition can be easily scraped using a squeegee. Further, the plate separation becomes satisfactory. A firing material composition suitable for screen printing is obtained by blending the solvent (A).

The relative evaporation rate of the solvent (A) to butyl acetate is preferably 2.0 or less and more preferably 1.0 or less. Further, the relative evaporation rate of the solvent (A) to butyl acetate is preferably 0.001 or greater and more preferably 0.002 or greater.

The relative evaporation rate is a value measured according to the test method specified in ASTM D3539. The relative evaporation rate with respect to butyl acetate represents a converted value at the time of setting the value of the evaporation rate of butyl acetate measured according to such a measuring method to 1.

Examples of the solvent (A) include butyl carbitol, propylene glycol monomethyl ether, isobutyl acetate, isobornyl cyclohexanol, decyl alcohol, ethyl cellosolve, butyl cellosolve, cyclohexanone, isophorone, and isobutyl alcohol. The solvent (A) may be formed by blending only one solvent or a combination of two or more solvents.

At least some of the solvent (A) may be used as a high-boiling-point solvent that disperses the above-described sinterable metal particles.

<Other Additives>

In addition to the sinterable metal particles, the non-sinterable metal particles, the binder component, and the solvent (A), the firing material composition according to the present embodiment may contain other additives that do not correspond to the sinterable metal particles, the non-sinterable metal particles, the binder component, and the solvent (A) within a range where the effects of the present invention are not affected.

Examples of other additives which may be contained in the firing material composition according to the present embodiment include a dispersant, a plasticizer, a tackifier, a storage stabilizer, an antifoaming agent, a thermal decomposition accelerator, and an antioxidant. The film-shaped firing material may contain only one, or two or more kinds of additives. These additives are not particularly limited and can be appropriately selected from those which have been typically used in this field.

Further, the firing material composition according to the present embodiment may contain other solvents (hereinafter, noted as other solvents (B)") having a relative evaporation rate of greater than 4.0 with respect to butyl acetate within the range where the effects of the present invention are not affected.

Examples of other solvents (B) which may be contained in the firing material composition according to the present embodiment include methyl acetate, ethyl acetate, acetone, tetrahydrofuran, and ethyl ether.

<Composition>

The firing material composition according to the present embodiment may be formed of the sinterable metal particles, the binder component, the solvent (A), and other additives, and the total content (% by mass) of these is 100% by mass.

In a case where the firing material composition according to the present embodiment contains the non-sinterable metal particles, the firing material composition may be formed of the sinterable metal particles, the non-sinterable metal particles, the binder component, the solvent (A), and other additives, and the total content (% by mass) of these is 100% by mass.

The content of the solvent (A) is in a range of 12% to 50% by mass, preferably in a range of 15% to 40% by mass, and more preferably in a range of 20% to 30% by mass with respect to the total mass (100% by mass) of the firing material composition. In a case where the content of the solvent (A) is less than or equal to the above-described upper limit, the shape of the firing material composition (transferred material) after the screen printing is likely to be maintained. Meanwhile, in a case where the content of the solvent (A) is greater than or equal to the above-described lower limit, plate separation at the time of screen printing of the firing material composition becomes satisfactory.

The content of all components other than the solvent (hereinafter, noted as the "solid content") is preferably in a range of 50% to 88% by mass, preferably in a range of 60% to 85% by mass, and more preferably in a range of 70% to 80% by mass with respect to the total mass (100% by mass) of the firing material composition.

The content of the sinterable metal particles is preferably in a range of 15% to 98% by mass, more preferably in a range of 15% to 90% by mass, and still more preferably in a range of 20% to 80% by mass with respect to the total mass (100% by mass) of the solid content in the firing material composition. In a case where the content of the sinterable metal particles is less than or equal to the above-described upper limit, since the content of the binder component can be sufficiently ensured, the shape of the film-shaped firing material obtained by screen-printing the firing material composition is likely to be maintained. Meanwhile, in a case where the content of the sinterable metal particles is greater than or equal to the above-described lower limit, the sinterable metal particles or the sinterable metal particles and the non-sinterable metal particles are fused at the time of firing the film-shaped firing material so that high bonding adhesive strength (shear adhesive force) is exhibited after the particles are fired.

In a case where the firing material composition contains the non-sinterable metal particles, the total content of the sinterable metal particles and the non-sinterable metal particles is preferably in a range of 50% to 98% by mass, more preferably in a range of 70% to 95% by mass, and still more preferably in a range of 80% to 90% by mass with respect to the total mass (100% by mass) of the solid content in the firing material composition.

The content of the binder component is preferably in a range of 2% to 50% by mass, more preferably in a range of 5% to 30% by mass, and still more preferably in a range of 5% to 20% by mass with respect to the total mass (100% by mass) of the solid content in the firing material composition. In a case where the content of the binder component is less than or equal to the above-described upper limit, the content of the sinterable metal particles can be sufficiently ensured, and thus the bonding adhesive force between the film-shaped firing material and the adherend is improved. In a case where the content of the binder component is greater than or equal to the above-described lower limit, the shape of the film-shaped firing material is likely to be maintained.

The mass ratio (sinterable metal particles:binder component) of the sinterable metal particles to the binder component in the firing material composition is preferably in a range of 50:1 to 1:5, more preferably in a range of 20:1 to 1:2, and still more preferably in a range of 10:1 to 1:1. In a case where the firing material composition contains the non-sinterable metal particles, the mass ratio ((sinterable metal particles+non-sinterable metal particles):binder component) of the sinterable metal particles and the non-sinterable metal particles to the binder component is preferably in a range of 50:1 to 1:1, more preferably in a range of 20:1 to 2:1, and still more preferably in a range of 9:1 to 4:1.

The content of other solvents (B) is preferably 10% by mass or less, more preferably 5% by mass or less, and still more preferably 3% by mass or less with respect to the total mass (100% by mass) of the firing material composition.

The printability of the firing material composition tends to increase as the content of other solvents (B) decreases. Accordingly, it is preferable that the firing material composition not substantially contain other solvents (B).

Here, the expression "does not substantially contain" indicates that the content of other solvents (B) is less than 0.1% by mass with respect to the total mass (100% by mass) of the firing material composition.

<Viscosity>

A viscosity (C) of the firing material composition according to the present embodiment which is measured at a temperature of 23° C. and a shear rate of 1 sec$^{-1}$ is in a range of 10 to 1000 Pa·s, and a viscosity (D) thereof which is measured at a temperature of 23° C. and a shear rate of 1000 sec$^{-1}$ is preferably in a range of 1 to 10 Pa·s.

The viscosity (C) is more preferably in a range of 20 to 900 Pa·s and still more preferably in a range of 25 to 800 Pa·s.

The viscosity (D) is more preferably 1 Pa·s or greater and less than 10 Pa·s and still more preferably in a range of 2 to 9 Pa·s.

The viscosity (C) and the viscosity (D) are values measured using a dynamic viscoelasticity measuring device (rheometer) in conformity with JIS Z 8803:2011. The details of the measuring method will be described later.

During the screen printing of the firing material composition, the shear stress is applied to the firing material composition. Accordingly, it is preferable that the firing material composition have excellent fluidity at the time of application of the shear stress. However, in a case where the viscosity of the firing material composition is extremely decreased in order to increase the fluidity, there is a tendency that the shape of the image pattern after the printing is unlikely to be maintained.

In a case where the viscosity (D) is less than or equal to the above-described upper limit, the fluidity can be exhibited as appropriate at the time of application of the shear stress to the firing material composition, and the plate separation during the screen printing becomes satisfactory. In a case where the viscosity (C) is greater than or equal to the above-described lower limit, the viscosity can be exhibited as appropriate at the time of elimination of the shear stress applied to the firing material composition, and the shape of the image pattern after the print is likely to be maintained.

Further, in a case where the viscosity (C) is less than or equal to the above-described upper limit, the plate separation during the screen printing becomes satisfactory. In a case where the viscosity (D) is greater than or equal to the above-described lower limit, the shape of the image pattern after the printing is likely to be maintained.

The viscosity (C) and the viscosity (D) can be controlled by the content or the relative evaporation rate of the solvent (A) contained in the firing material composition. Specifically, the viscosity (C) and the viscosity (D) tend to decrease as the relative evaporation rate of the solvent (A) with respect to butyl acetate increases. Further, the viscosity (C) and the viscosity (D) tend to increase as the content of the solvent (A) decreases.

<Production Method>

A method of producing the firing material composition includes a step (mixing step) of mixing the sinterable metal particles, the binder component, and the solvent (A) with non-sinterable metal particles, other additives, and other solvents (B) as necessary.

As described above, as the sinterable metal particles, sinterable metal particles which have been dispersed in a high-boiling-point solvent in advance may be used or sinterable metal particles which have been dispersed in other solvents (B) in advance may be used (a dispersion liquid of metal particles). The solvent (A) may be used as the high-boiling point solvent. In a case where the solvent (A) is used as the high-boiling point solvent, the solvent (A) used as the high-boiling-point solvent may be the same as or different from the solvent (A) used in the mixing step. Further, in the case where the solvent (A) is used as the high-boiling point solvent, the total amount of the solvent (A) used as the high-boiling-point solvent and the solvent (A) used in the mixing step is adjusted to be in a range of 12% to 50% by mass with respect to the total mass of the firing material composition.

Since the firing material composition according to the present embodiment contains a specific amount of the solvent (A), the plate separation during the screen printing becomes satisfactory. In addition, the shape of the image pattern after the screen printing is likely to be maintained.

As described above, the firing material composition according to the present embodiment has excellent printability, and thus the film-shaped firing material having a desired shape can be produced with excellent productivity using the firing material composition according to the present embodiment.

The firing material composition according to the present embodiment is a paste-like firing material composition which contains sinterable metal particles, a binder component, and a solvent having a relative evaporation rate of 4.0 or less with respect to butyl acetate, in which the content of the solvent is in a range of 12% to 50% by mass with respect to the total mass of the firing material composition. Further, it is preferable to use a mixed solvent of a dispersion medium having a relative evaporation rate of $1.0 \times 10^{-5}$ to $1.0 \times 10^{-3}$ and a diluent solvent having a relative evaporation rate of 0.001 to 4.0 as the solvent.

Preferred examples of the dispersion medium include isobornyl cyclohexanol, decyl alcohol, and a mixture thereof. As the diluent solvent, one or two or more kinds selected from the group consisting of butyl carbitol, propylene glycol monomethyl ether, and isobutyl acetate is preferable.

Further, in the firing material composition according to the present embodiment, it is preferable that the content of the solvent be in a range of 15% to 40% by mass and more preferable that the content of the dispersion medium be in a range of 10% to 20% by mass and the content of the diluent solvent is in a range of 1% to 20% by mass with respect to the total mass (100% by mass) of the firing material composition.

<<Method of Producing Film-Shaped Firing Material>>

A method of producing the film-shaped firing material includes a step of screen-printing the above-described firing material composition on the support.

As the support, a release film is an exemplary example.

Examples of the release film include transparent films such as a polyethylene film, a polypropylene film, a polybutene film, a polybutadiene film, a polymethyl pentene film, a polyvinyl chloride film, a vinyl chloride copolymer film, a polyethylene terephthalate film, a polyethylene naphthalate film, a polybutylene terephthalate film, a polyurethane film, an ethylene vinyl acetate copolymer film, an ionomer resin film, an ethylene-(meth)acrylic acid copolymer film, an ethylene-(meth)acrylic acid ester copolymer film, a polystyrene film, a polycarbonate film, a polyimide film, and a fluorine resin film. Further, crosslinked films of these can also be used. Further, laminated films of these may also be used. Further, films obtained by coloring these films and opaque films can also be used. The release film can be obtained by coating the surface with a release agent and performing a peeling treatment thereon. Examples of a release agent include a silicone-based release agent, a fluorine-based release agent, an olefin-based release agent, an alkyd-based release agent, and a long-chain alkyl group-containing carbamate.

The thickness of the release film is typically in a range of 10 to 500 µm, preferably in a range of 15 to 300 µm, and particularly preferably in a range of 20 to 250 µm.

The contact angle between the firing material composition and the support is preferably in a range of 20° to 60°, more preferably in a range of 30° to 55°, and still more preferably in a range of 35° to 50°. In a case where the contact angle is less than or equal to the above-described upper limit, the adhesiveness of the firing material composition to the support is improved. In addition, shrinkage of the firing material composition on the support after the printing can be suppressed, and thus the shape of the image pattern can be more satisfactorily maintained. Further, in a case where the contact angle is greater than or equal to the above-described lower limit, wetting spread of the firing material composition on the support after the printing can be suppressed, and thus the shape of the image pattern can be more satisfactorily maintained. The contact angle can be measured according to the following measuring method in conformity with JIS R 3257:1999.

The printing of the firing material composition can be performed according to a known screen printing method, and specific examples thereof include a silk screen printing method and a rotary screen printing method.

Specifically, the screen printing is performed under various conditions such as a clearance of 0.5 to 5.0 mm, a squeegee printing pressure of 0.05 to 0.5 MPa, a scraper printing pressure of 0.05 to 0.5 MPa, a squeegee speed of 10 to 100 mm/sec, and a scraper speed of 10 to 100 mm/sec.

After the printing, the firing material composition on the support is dried, and the solvent contained in the firing material composition is volatilized to obtain a film-shaped firing material.

The condition for drying the firing material composition is not particularly limited, but it is preferable that the firing material composition be dried by being heated. In this case, it is preferable that the firing material composition be dried, for example, under conditions of a temperature of 70° C. to 250° C. or a temperature of 80° C. to 180° C. for 10 seconds to 10 minutes.

<Film-Shaped Firing Material>

The film-shaped firing material obtained by the present invention contains sinterable metal particles and a binder component.

FIG. 1 is a cross-sectional view schematically illustrating an embodiment of a film-shaped firing material obtained by the present invention. A film-shaped firing material 1 contains sinterable metal particles 10 and a binder component 20.

The film-shaped firing material may be formed of one layer (single layer) or two or more of a plurality of layers, for example, two to ten layers. In a case where the film-shaped firing material is formed of a plurality of layers, the plurality of layers may be the same as or different from one another, and a combination of the plurality of layers is not particularly limited as long as the effects of the present invention are not affected. The film-shaped firing material formed of two or more of a plurality of layers is obtained by overprinting the firing material composition through the screen printing.

Further, in the present specification, the expression "the plurality of layers may be the same as or different from one another" means that "all layers may be the same as one another, all layers may be different from one another, or only some layers may be the same as one another" and the expression "the plurality of layers are different from one another" means that "at least one of the constituent materials of each layer, the compounding ratios of constituent materials, and the thicknesses of layers are different from one another" without limiting to the case of the film-shaped firing material.

The shape of the film-shaped firing material may be appropriately set according to the target shape of sinter bonding, and a circular shape or a rectangular shape is preferable. The circular shape is a shape corresponding to the shape of the semiconductor wafer. The rectangular shape is a shape corresponding to the shape of the chip. The corresponding shape may be the same or approximately the same as the target shape of sinter bonding.

In a case where the film-shaped firing material is a circular shape, the area of the circle may be in a range of 3.5 to 1600 $cm^2$ or may be in a range of 85 to 1400 $cm^2$. In a case where the film-shaped firing material is a rectangular shape, the area of the rectangle may be in a range of 0.01 to 25 $cm^2$ or may be in a range of 0.25 to 9 $cm^2$.

The thickness of the film-shaped firing material before being fired is not particularly limited, but is preferably in a range of 10 to 200 μm, preferably in a range of 20 to 150 μm, and more preferably in a range of 30 to 90 μm.

Here, the "thickness of the film-shaped firing material" indicates the thickness of the entire film-shaped firing material. For example, the thickness of the film-shaped firing material formed of a plurality of layers indicates the total thickness of all layers constituting the film-shaped firing material.

In the present specification, the "thickness" can be acquired using a constant pressure thickness-measuring device in conformity with JIS K7130 as a value obtained by averaging the measured thicknesses at five optional sites.

According to the method of producing the film-shaped firing material according to the present embodiment, since the firing material composition of the present invention which has excellent printability can be molded in the form of a film through the screen printing, a film-shaped firing material with a uniform thickness and a desired shape can be produced with excellent productivity. Accordingly, for example, the film-shaped firing material can also be produced in a circular shape according to the shape of the semiconductor wafer, and the yield thereof with respect to the raw material is improved without generating scraps which are generated in a case where the punching is performed. Therefore, waste loss can be reduced. Particularly, since the sinterable metal particles contained in the film-shaped firing material are a relatively expensive material, reduction of waste loss of the raw material leads to significant reduction of the price of products, which is extremely beneficial.

Further, according to the method of producing the film-shaped firing material of the present embodiment, it is possible to provide the film-shaped firing material in a state of being laminated on the support. At the time of use, the film-shaped firing material may be disposed on an object to be sinter-bonded after the support is peeled off from the film-shaped firing material. The support also has a function of a protective film for preventing damage to the film-shaped firing material or preventing adhesion of dirt thereto. The support may be provided on at least one side of the film-shaped firing material or on both sides of the film-shaped firing material.

The film-shaped firing material obtained by the present invention can be made into a film-shaped firing material with a support sheet provided with a support sheet on at least one side (surface) thereof.

The details of the film-shaped firing material with a support sheet are as follows.

<<Film-Shaped Firing Material with a Support Sheet>>

A film-shaped firing material with a support sheet includes the above-described film-shaped firing material and a support sheet provided on at least one side (surface) of the above-described film-shaped firing material. The support sheet is formed such that a pressure-sensitive adhesive layer is provided on the entire surface or the outer peripheral portion of a base film, and it is preferable that the film-shaped firing material be provided on the pressure-sensitive adhesive layer. The film-shaped firing material may be provided by being brought into direct contact with the pressure-sensitive adhesive layer or provided by being brought into direct contact with the base film. By employing the present form, the material can be used as a dicing sheet used at the time of dividing a semiconductor wafer into chips. Further, the film-shaped firing material having the same shape as the shape of chip can be processed by being divided together with the semiconductor wafer using a blade or the like, and a chip with the film-shaped firing material can be produced.

Figure 2:
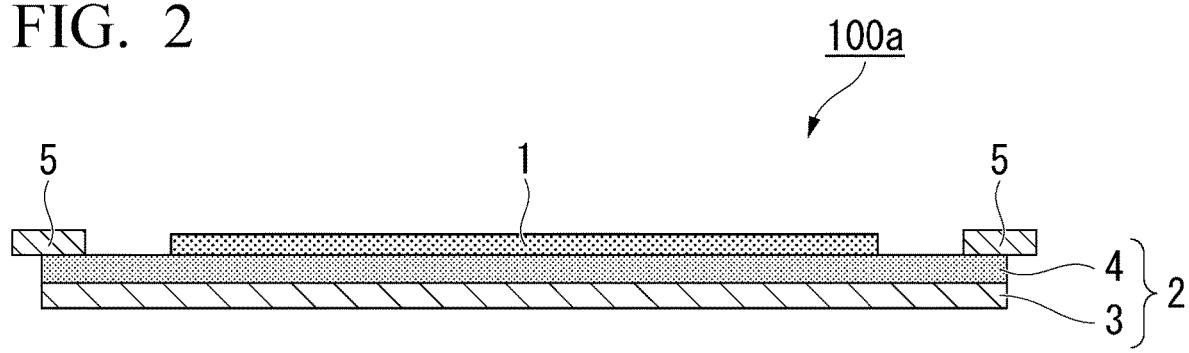
FIG. 2 is a cross-sectional view schematically illustrating an embodiment of a film-shaped firing material with a support sheet obtained by the present invention.
Figure 3:
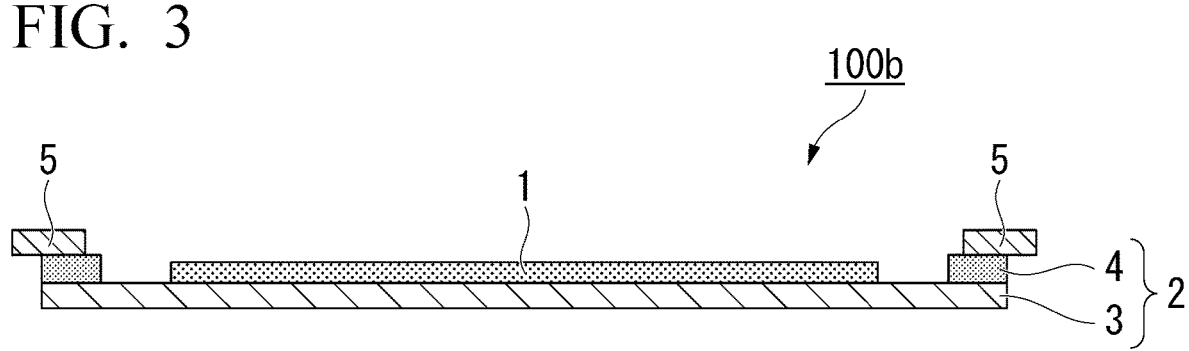
FIG. 3 is a cross-sectional view schematically illustrating an embodiment of a film-shaped firing material with a support sheet obtained by the present invention.

Hereinafter, an embodiment of the film-shaped firing material with a support sheet will be described. FIGS. 2 and 3 are cross-sectional views schematically illustrating the film-shaped firing material with a support sheet according to the present embodiment. As illustrated in FIGS. 2 and 3, film-shaped firing material with a support sheets 100a and 100b according to the present embodiment are formed such that the film-shaped firing material 1 is temporarily and peelably attached to the inner peripheral portion of a support sheet 2 having a pressure-sensitive adhesive portion on the outer peripheral portion. As illustrated in FIG. 2, the support sheet 2 is a pressure-sensitive adhesive sheet having a pressure-sensitive adhesive layer 4 on the upper surface of a base film 3, and the surface of the inner peripheral portion of the pressure-sensitive adhesive layer 4 is covered with the film-shaped firing material to expose the pressure-sensitive adhesive portion to the outer peripheral portion. Further, as illustrated in FIG. 3, the support sheet 2 may include a ring-shaped pressure-sensitive adhesive layer 4 on the outer peripheral portion of the base film 3.

The film-shaped firing material 1 is formed in approximately the same shape as the shape of a workpiece (a semiconductor wafer or the like) to be attached to the inner peripheral portion of the support sheet 2. The support sheet 2 has a pressure-sensitive adhesive portion on the outer peripheral portion. According to a preferable aspect, the film-shaped firing material 1 having a diameter smaller than the diameter of the support sheet 2 is concentrically laminated on the circular support sheet 2. The pressure-sensitive adhesive portion on the outer peripheral portion is used for fixing a ring frame 5 as illustrated in the figure.

(Base Film)

The base film 3 is not particularly limited, and examples thereof include films formed of low density polyethylene (LDPE), linear low density polyethylene (LLDPE), an ethylene-propylene copolymer, polypropylene, polybutene, polybutadiene, polymethylpentene, an ethylene-vinyl acetate copolymer, an ethylene-(meth)acrylic acid copolymer, an ethylene-methyl (meth)acrylate copolymer, an ethylene-ethyl (meth)acrylate copolymer, polyvinyl chloride, a vinyl chloride-vinyl acetate copolymer, a polyurethane film, and an ionomer. In the present specification, "(meth)acryl" includes both acryl and methacryl.

Further, in a case where the support sheet is required to have high heat resistance, examples of the base film 3 include a polyester film such as polyethylene terephthalate, polybutylene terephthalate, or polyethylene naphthalate, and a polyolefin film such as polypropylene or polymethyl pentene. In addition, crosslinked films of these or modified films using radiation, electric discharge, and the like can also be used. The base film may be a laminate of the above-described films.

Further, these films can be used by laminating two or more films thereof or by combining the films. Further, films obtained by coloring these films or performing printing thereon can also be used. Further, the films may be formed into a sheet by performing extrusion molding a thermoplastic resin or may be stretched. Further, films formed into a sheet by thinning and curing a curable resin through predetermined means may be used.

The thickness of the base film is not particularly limited, but is preferably in a range of 30 to 300 μm and more preferably in a range of 50 to 200 μm. By setting the thickness of the base film to be in the above-described range, rupture of the base film is unlikely to occur even in a case where cutting is performed by means of dicing. Further, since the flexibility is sufficiently imparted to the film-shaped firing material with a support sheet, the film-shaped firing material exhibits satisfactory adhesiveness to a workpiece (for example, a semiconductor wafer).

The base film can be obtained by coating the surface with a release agent and performing a peeling treatment. As the release agent used for the peeling treatment, an alkyd-based release agent, a silicone-based release agent, a fluorine-based release agent, an unsaturated polyester-based release agent, a polyolefin-based release agent, or a wax-based release agent is used. Among these, from the viewpoint of heat resistance, an alkyd-based release agent, a silicone-based release agent, or a fluorine-based release agent is particularly preferable.

In order to perform the peeling treatment on the surface of the base film using the release agent, the surface thereof is coated with the release agent in the absence of a solvent or after being diluted with a solvent or emulsified, using a gravure coater, a Meyer bar coater, an air knife coater, or a roll coater, and the base film coated with the release agent is provided at room temperature or under a heating condition or may be cured by electron beams to form a laminate through wet lamination, dry lamination, hot melt lamination, melt extrusion lamination, or coextrusion process.

(Pressure-Sensitive Adhesive Layer)

The support sheet 2 has a pressure-sensitive adhesive portion on at least the outer peripheral portion thereof. It is preferable that the pressure-sensitive adhesive portion have a function of temporarily fixing the ring frame 5 on the outer peripheral portions of film-shaped firing material with a support sheet 100a and 100b, and the ring frame 5 is peelable after required steps are carried out. Therefore, as the pressure-sensitive adhesive layer 4, a layer with low tackiness may be used, or an energy ray-curable layer having an adhesive force which is decreased at the time of irradiation with energy rays may be used. A repeelable pressure-sensitive adhesive layer can be formed using various known pressure-sensitive adhesives (for example, a general purpose pressure-sensitive adhesive such as a rubber-based pressure-sensitive adhesive, an acrylic pressure-sensitive adhesive, a silicone-based pressure-sensitive adhesive, a urethane-based pressure-sensitive adhesive, or a polyvinyl ether-based pressure-sensitive adhesive, a pressure-sensitive adhesive with surface unevenness, an energy ray-curable pressure-sensitive adhesive, or a thermal expansion component-containing pressure-sensitive adhesive).

The support sheet 2 is a pressure-sensitive adhesive sheet having a typical configuration provided with the pressure-sensitive adhesive layer 4 on the entire upper surface of the base film 3 as illustrated in FIG. 2. Alternatively, the support sheet may have a configuration in which the surface of the pressure-sensitive adhesive layer 4 on the inner peripheral portion is covered with the film-shaped firing material and the pressure-sensitive adhesive portion is exposed to the outer peripheral portion. In this case, the outer peripheral portion of the pressure-sensitive adhesive layer 4 is used for fixing the above-described ring frame 5, and the film-shaped firing material is peelably laminated on the inner peripheral portion. As the pressure-sensitive adhesive layer 4, a layer with low tackiness may be used in the same manner as described above, or an energy ray-curable pressure-sensitive adhesive may be used.

In the configuration illustrated in FIG. 3, the ring-shaped pressure-sensitive adhesive layer 4 is formed on the outer peripheral portion of the base film 3 and is set as a pressure-sensitive adhesive portion. At this time, the pressure-sensitive adhesive layer 4 may be a single pressure-sensitive adhesive layer formed of the above-described pressure-sensitive adhesive or may be obtained by circularly cutting double-sided pressure-sensitive adhesive tape containing a pressure-sensitive adhesive layer formed of the above-described pressure-sensitive adhesive.

As a weak pressure-sensitive adhesive, an acrylic pressure-sensitive adhesive or a silicone-based pressure-sensitive adhesive is preferably used. Further, in consideration of the peelability of the film-shaped firing material, the adhesive force of the pressure-sensitive adhesive layer 4 on a SUS plate at 23° C. is preferably in a range of 30 to 120 mN/25 mm, more preferably in a range of 50 to 100 mN/25 mm, and still more preferably in a range of 60 to 90 mN/25 mm. In a case where the adhesive force is extremely low, the ring frame may drop off. Further, in a case where the adhesive force is extremely high, the pressure-sensitive adhesive layer 4 is unlikely to be peeled off from the ring frame, and thus the ring frame is unlikely to be reused.

In a case where a repeelable pressure-sensitive adhesive layer which is curable by energy rays is used in the support sheet with the configuration of FIG. 2, the tackiness may be decreased by irradiating a region where the film-shaped firing material is laminated with energy rays in advance. At this time, the adhesive force in other regions may be maintained to be high without performing irradiation with energy rays for the purpose of bonding the ring frame 5. In order to not irradiate other regions with energy rays, for example, irradiation with energy rays may be performed from the base film side by providing an energy ray shielding layer in regions corresponding to other regions of the base film through printing or the like. In the support sheet with the configuration of FIG. 2, the surface where the pressure-sensitive adhesive layer 4 of the base film 3 is provided can be subjected to a roughening treatment such as sand blasting or a solvent treatment or an oxidation treatment such as a corona discharge treatment, irradiation with electron beams, a plasma treatment, an ozone ultraviolet irradiation treatment, a flame treatment, a chromic acid treatment or an hot air treatment as desired, for the purpose of strengthening bonding between the base film 3 and the pressure-sensitive adhesive layer 4. In addition, a primer treatment can be performed.

The thickness of the pressure-sensitive adhesive layer 4 is not particularly limited, but is preferably in a range of 1 to 100 μm, more preferably in a range of 2 to 80 μm, and particularly preferably in a range of 3 to 50 μm.

(Film-Shaped Firing Material with a Support Sheet)

The film-shaped firing material with a support sheet is formed such that the film-shaped firing material is temporarily and peelably attached to the inner peripheral portion of a support sheet having a pressure-sensitive adhesive portion on the outer peripheral portion. In the configuration example illustrated in FIG. 2, the film-shaped firing material with a support sheet 100a is formed such that the film-shaped firing material 1 is peelably laminated on the inner peripheral portion of the support sheet 2 formed of the base film 3 and the pressure-sensitive adhesive layer 4, and the pressure-sensitive adhesive layer 4 is exposed to the outer peripheral portion of the support sheet 2. In this configuration example, it is preferable that the film-shaped firing material 1 having a diameter smaller than the diameter of the support sheet 2 be concentrically and peelably laminated on the pressure-sensitive adhesive layer 4 of the support sheet 2.

The film-shaped firing material with a support sheet 100a having the above-described configuration is attached to the ring frame 5 in the pressure-sensitive adhesive layer 4 exposed to the outer peripheral portion of the support sheet 2.

Further, cyclic double-sided tape or a pressure-sensitive adhesive layer may be separately provided on the paste (the pressure-sensitive adhesive layer exposed to the outer peripheral portion of the pressure-sensitive adhesive sheet) with respect to the ring frame. The double-sided tape has a configuration of a pressure-sensitive adhesive layer, a core material, and a pressure-sensitive adhesive layer, and the pressure-sensitive adhesive layer in the double-sided tape is not particularly limited, and a pressure-sensitive adhesive such as a rubber-based pressure-sensitive adhesive, an acrylic pressure-sensitive adhesive, a silicone-based pressure-sensitive adhesive, or polyvinyl ether is used. The pressure-sensitive adhesive layer is attached to the ring frame on the outer peripheral portion at the time of production of a substrate with a chip described below. Preferred examples of the core material of the double-sided tape include a polyester film, a polypropylene film, a polycarbonate film, a polyimide film, a fluorine resin film, and a liquid crystal polymer film.

Figure 4:
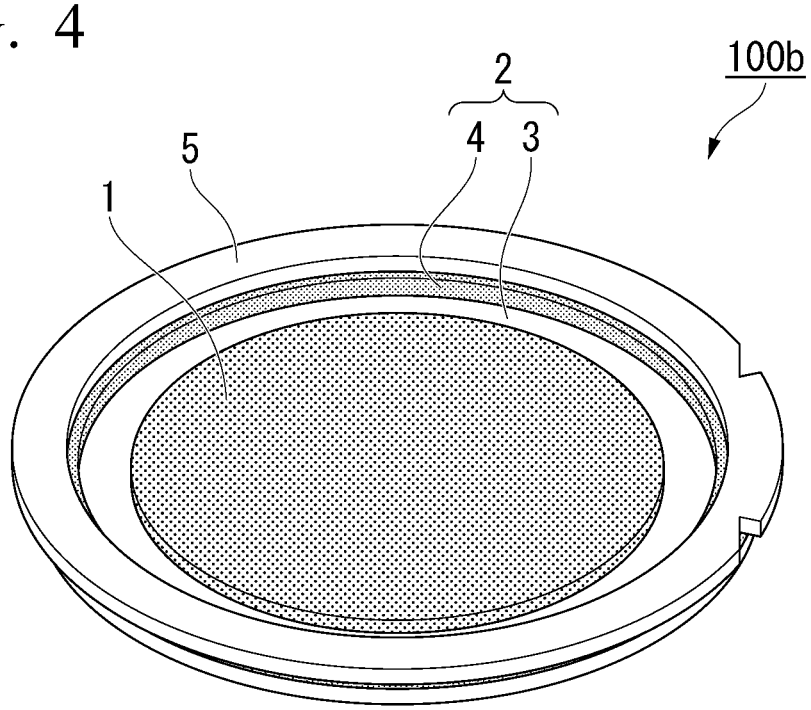
FIG. 4 is a perspective view schematically illustrating an embodiment of a state in which a film-shaped firing material with a support sheet obtained by the present invention is attached to a ring frame.

In the configuration example illustrated in FIG. 3, the ring-shaped pressure-sensitive adhesive layer 4 is formed on the outer peripheral portion of the base film 3 and is set as a pressure-sensitive adhesive portion. FIG. 4 is a perspective view illustrating the film-shaped firing material with a support sheet 100b illustrated in FIG. 3. At this time, the pressure-sensitive adhesive layer 4 may be a single pressure-sensitive adhesive layer formed of the pressure-sensitive adhesive or may be obtained by circularly cutting double-sided pressure-sensitive adhesive tape containing a pressure-sensitive adhesive layer formed of the pressure-sensitive adhesive. The film-shaped firing material 1 is peelably laminated on the inner peripheral portion of the base film 3 enclosed by the pressure-sensitive adhesive portion. In this configuration example, it is preferable that the film-shaped firing material 1 having a diameter smaller than the diameter of the support sheet 2 be concentrically and peelably laminated on the base film 3 of the support sheet 2.

A release film may be provided on the film-shaped firing material with a support sheet for the purpose of surface protection in order to avoid contact of any one or both surfaces of the film-shaped firing material and the pressure-sensitive adhesive portion with the outside until the material is provided for use.

The surface protective film (release film) can be obtained by performing the above-described peeling treatment on the surface of the base film such as polyethylene, polyethylene terephthalate, polybutylene terephthalate, polyethylene naphthalate, or polypropylene using a release agent. Examples of the release agent used for the peeling treatment include the release agents exemplified in the section of the base film.

The thickness of the film-shaped firing material with a support sheet is preferably in a range of 1 to 500 μm, more preferably in a range of 5 to 300 μm, and still more preferably in a range of 10 to 150 μm. Here, the "thickness of the film-shaped firing material with a support sheet" indicates the thickness of the entire film-shaped firing material with a support sheet. For example, the thickness of the film-shaped firing material with a support sheet formed of a plurality of layers indicates the total thickness of all layers constituting the film-shaped firing material with a support sheet.

<<Method of Producing Film-Shaped Firing Material with a Support Sheet>>

A method of producing the film-shaped firing material with a support sheet includes a step of providing the film-shaped firing material on the support sheet after the film-shaped firing material is obtained using the method of producing the film-shaped firing material of the present invention described above.

For example, a film-shaped firing material is formed on a release film according to the method of producing the film-shaped firing material, using a release film as the support, and another release film is laminated on the film-shaped firing material to prepare a laminate having a configuration that includes the release film, the film-shaped firing material, and the release film in this order in advance. In addition, a film-shaped firing material with a support sheet having a configuration that includes the support sheet, the film-shaped firing material, and the release film in this order can be produced by laminating the support sheet on the film-shaped firing material while the release film is peeled off from the film-shaped firing material. The release film on the film-shaped firing material may be removed after formation of the laminated structure as necessary.

Further, a film-shaped firing material is formed on a release film according to the method of producing the film-shaped firing material, using a release film as the support, and another release film is laminated on the film-shaped firing material to prepare a laminate having a configuration that includes the release film, the film-shaped firing material, and the release film in this order in advance. A pressure-sensitive adhesive layer is formed on a release film by coating another release film with a pressure-sensitive adhesive composition, and drying the composition and allowing the solvent to volatilize to obtain the shape of a film as necessary. Next, a base film is laminated on the pressure-sensitive adhesive layer to prepare a laminate having a configuration that includes the base film, the pressure-sensitive adhesive layer, and the release film in this order. Further, a film-shaped firing material with a support sheet having a configuration that includes the base film, the pressure-sensitive adhesive layer, the film-shaped firing material, and the release film in this order can also be produced by laminating the film-shaped firing material on the exposed surface of the pressure-sensitive adhesive layer which has been laminated on the base film while the release film is peeled off from the film-shaped firing material and the pressure-sensitive adhesive layer. The release film on the film-shaped firing material may be removed after formation of the laminated structure as necessary.

As described above, since both the pressure-sensitive adhesive layer and the film-shaped firing material constituting the film-shaped firing material with a support sheet can be formed on the release film in advance and laminated using a method of bonding the layers to the surface of a target layer, the film-shaped firing material with a support sheet may be produced by appropriately selecting a layer that employs such a step as necessary.

Further, the film-shaped firing material with a support sheet may be stored in a state in which all the required layers are provided and then the release film is attached to the surface of the outermost layer on a side opposite to the support sheet.

Further, according to the method of producing the film-shaped firing material, the film-shaped firing material may be formed by screen-printing the firing material composition of the present invention on a support sheet using the support sheet as the support.

<<Method of Producing Substrate with Chip>>

Next, a method of utilizing the film-shaped firing material with a support sheet according to the present invention will be described based on an example of a case where the firing material is used for production of a substrate with a chip.

According to the embodiment of the present invention, the method of producing a substrate with a chip obtained by using the film-shaped firing material with a support sheet is performed by peeling the release film off from the film-shaped firing material with a support sheet and attaching the film-shaped firing material with a support sheet to the rear surface of a semiconductor wafer (workpiece). The following steps (1) and (2) may be performed in order of the step (1) and the step (2), and the following steps (1) to (4) may be performed in order of the step (1), the step (2), the step (3), and the step (4).

Step (1): a step of dicing the semiconductor wafer (workpiece) and the film-shaped firing material of the laminate formed by sequentially laminating the support sheet, the film-shaped firing material, and the semiconductor wafer (workpiece);

Step (2): a step of peeling the support sheet off from the film-shaped firing material to obtain a chip with the film-shaped firing material;

Step (3): a step of attaching the chip with the film-shaped firing material to the surface of a substrate; and Step (4): a step of firing the film-shaped firing material and bonding the chip and the substrate Hereinafter, a case of performing the steps (1) to (4) will be described.

The semiconductor wafer may be a silicon wafer or a silicon carbide wafer or may be a compound semiconductor wafer such as gallium arsenic. A circuit may be formed on the surface of the semiconductor wafer. The circuit on the wafer surface can be formed according to various methods which have been commonly used in the related art such as an etching method and a lift-off method. Next, a surface (rear surface) of the semiconductor wafer opposite to the circuit surface is ground. The grinding method is not particularly limited, and the surface is ground by known means using a grinder. At the time of grinding the rear surface, a pressure-sensitive adhesive sheet which is referred to as a surface-protective sheet is attached to the circuit surface for the purpose of protecting the circuit on the surface. The grinding of the rear surface is carried out by fixing the circuit surface side (that is, the surface-protective sheet side) of the wafer using a chuck table or the like and grinding the rear surface side where the circuit is not formed using a grinder. The thickness of the wafer after being ground is not particularly limited, but is typically in a range of 20 to 500 μm. Next, a fractured layer generated during the grinding of the rear surface is removed as necessary. The fractured layer is removed by performing chemical etching, plasma etching, or the like.

Next, the film-shaped firing material of the film-shaped firing material with a support sheet is attached to the rear surface of the semiconductor wafer. Thereafter, the steps (1) to (4) are performed in order of the step (1), the step (2), the step (3), and the step (4).

The laminate of the semiconductor wafer, the film-shaped firing material, and the support sheet is diced for each circuit formed on the surface of the wafer to obtain a laminate of the chip, the film-shaped firing material, and the support sheet. The dicing is performed by cutting the semiconductor wafer and the film-shaped firing material simultaneously. According to the film-shaped firing material with a support sheet according to the present embodiment, since the adhesive force is exhibited between the film-shaped firing material and the support sheet during the dicing, chipping and chip jump can be prevented. Therefore, the dicing adaptability is excellent. The dicing is not particularly limited, and a method of fixing the peripheral portion (an outer peripheral portion of a support) of the support sheet with the ring frame at the time of dicing the semiconductor wafer and dividing the semiconductor wafer according to a known technique of using a rotary round blade such as a dicing blade is an exemplary example of the dicing method. The film-shaped firing material may be completely cut, and the cut depth of the support sheet resulting from dicing is preferably in a range of 0 to 30 μm from the interface between the film-shaped firing material and the support sheet. By decreasing the amount of the support sheet to be cut, it is possible to suppress fusing of the pressure-sensitive adhesive layer or the base film constituting the support sheet caused by the friction of the dicing blade or generation of burrs and the like.

Further, particularly a chip obtained by dividing the semiconductor wafer having a surface on which a circuit is formed is also referred to as an element or a semiconductor element.

Thereafter, the support sheet may be expanded. In a case where a base film having excellent extensibility is selected as the base film of the support sheet, the support sheet has excellent expandability. By picking up the diced chips with the film-shaped firing material by general means such as a collet, the film-shaped firing material and the support sheet are peeled from each other. As a result, a chip (a chip with the film-shaped firing material) having a film-shaped firing material on the rear surface is obtained.

Next, the chip with the film-shaped firing material is attached to the surface of the substrate. The substrate includes a lead frame, a heat sink, and the like.

Next, the film-shaped firing material is fired so that the substrate and the chip are sinter-bonded. At this time, in a case where the exposed surface of the film-shaped firing material of the chip with the film-shaped firing material is attached to the substrate, the chip and the substrate can be sinter-bonded through the film-shaped firing material.

The heating temperature of firing the film-shaped firing material may be appropriately determined in consideration of the kind and the like of the film-shaped firing material, but is preferably in a range of 100° C. to 600° C., more preferably in a range of 150° C. to 550° C., and still more preferably in a range of 250° C. to 500° C. The heating time may be appropriately determined in consideration of the kind and the like of the film-shaped firing material, but is preferably in a range of 1 second to 60 minutes, more preferably in a range of 1 second to 30 minutes, and still more preferably in a range of 1 second to 10 minutes.

The film-shaped firing material may be fired by performing pressurizing and firing, in which the film-shaped firing material is fired by being pressurized. The condition for pressurization can be set to be, for example, in a range of 1 to 50 MPa.

According to the method of producing the substrate with a chip of the present embodiment, the film-shaped firing material with a highly uniform thickness can be simply formed on the rear surface of the chip without generating scraps, and cracks after the dicing step or the packing are unlikely to be generated. Further, according to the method of producing the substrate with a chip of the present embodiment, the chip with the film-shaped firing material can be obtained without separately attaching the film-shaped firing material to the rear surface of the divided chip, and thus the production step can be simplified. Further, a substrate with a chip in which the chip and the substrate are sinter-bonded through the film-shaped firing material by disposing the chip with the film-shaped firing material on a desired substrate and firing the substrate and the chip can be produced.

As an embodiment, a chip with the film-shaped firing material which includes a chip and the film-shaped firing material according to the present invention is obtained. As an example, the chip with the film-shaped firing material can be produced according to the method of producing the substrate with a chip described above.

Further, in the above-described embodiment, the example of the sinter bonding between the chip and the substrate of the film-shaped firing material has been described, but the target for the sinter bonding of the film-shaped firing material is not limited to the example described above, and the sinter bonding can be performed on various products sintered in contact with the film-shaped firing material.

Further, according to the above-described embodiment, the film-shaped firing material having the same shape as the shape of chip can be processed by being divided together with the semiconductor wafer using a blade or the like, and a chip with the film-shaped firing material can be produced. That is, in the chip with the film-shaped firing material, the size (area) of the contact surface of the film-shaped firing material is the same as the size of the contact surface of the chip, but these may be different from each other. For example, the substrate and the chip may be attached to each other through the film-shaped firing material in a state in which the contact surface of the film-shaped firing material is larger than the contact surface of the chip. Specifically, the film-shaped firing material having a desired size is disposed on the substrate, and the chip having a contact surface smaller than that of the film-shaped firing material may be attached to the film-shaped firing material.

EXAMPLES

Hereinafter, the present invention will be described in detail based on the examples, and the scope of the present invention is not limited to these examples and the like.

Examples 1 to 4 and Comparative Examples 1 to 3

<Production of Firing Material Composition>

Components used for producing a firing material composition will be described.

(Metal Particle Dispersion Liquid)

Mixed particles obtained by mixing alcohol derivative-coated silver nanoparticles (particle diameter of 15 to 55 nm) as sinterable metal particles with copper particles (particle diameter of 2000 to 5000 nm) as non-sinterable metal particles such that the mass ratio (sinterable metal particles:non-sinterable metal particles) was set to 1:5 were dispersed in a mixed solvent (the mass ratio of isobornyl cyclohexanol to decyl alcohol=1:1) of isobornyl cyclohexanol and decyl alcohol as a dispersion medium to prepare a metal particle dispersion liquid having a solid content concentration of 85% by mass.

Further, the relative evaporation rate of the isobornyl cyclohexanol with respect to the butyl acetate was $1.1 \times 10^{-5}$, and the relative evaporation rate of the decyl alcohol with respect to the butyl acetate was $1.0 \times 10^{-3}$.

(Binder Component)

A component obtained by allowing MEK to volatilize was used as a binder component from among commercially available acrylic polymers (2-ethylhexyl methacrylate polymer, mass-average molecular weight of 28000, L-0818, manufactured by The Nippon Synthetic Chemical Industry Co., Ltd., MEK diluted product, solid content of 54.5% by mass) under conditions of 60° C. and 200 hPa using an evaporator.

(Diluent Solvent)

Butyl carbitol (relative evaporation rate with respect to butyl acetate: 0.004)

Propylene glycol monomethyl ether (relative evaporation rate with respect to butyl acetate: 0.71)

Isobutyl acetate (relative evaporation rate with respect to butyl acetate: 1.45)

Cyclohexane (relative evaporation rate with respect to butyl acetate: 4.5)

The relative evaporation rate of each solvent with respect to butyl acetate was measured in the following manner.

The evaporation rate of each solvent was measured according to the test method specified in ASTM D3539 and converted to a relative evaporation rate obtained by setting the value of the evaporation rate of butyl acetate measured according to the same measuring method to 1.

The metal particle dispersion liquid, the binder component, and the diluent solvent were mixed to obtain the composition compounded as listed in Table 1 to obtain a paste-like firing material composition. The amount of the metal particles and the binder component compounded as shown in the table indicates the amount of the solid content.

In Table 1, the upper row in the columns of the relative evaporation rate of the dispersion medium shows the relative evaporation rate of isobornyl cyclohexanol, and the lower row thereof shows the relative evaporation rate of decyl alcohol.

<Production of Film-Shaped Firing Material>

As a support, one surface of a release film (SP-PET 382150, manufactured by Lintec Corporation, thickness of 38 μm) as a polyethylene terephthalate-based film having one surface to which a peeling treatment had been performed was screen-printed under the following conditions with the firing material composition obtained in the above-described manner using a circular mesh plate having a diameter of 15 cm and a metal squeegee and dried at 150°

C. for 10 minutes, thereby obtaining a circular film-shaped firing material whose one surface was protected by the release film.

(Printing Conditions)

Screen printer: MT-320TV, manufactured by Microtec Company, Ltd.
Screen version: 3D mesh (3D-80-225, printing diameter of 153 mm), manufactured by Sonocom Co., Ltd.
Clearance: 1.5 mm
Squeegee printing pressure: 0.18 MPa
Scraper printing pressure: 0.134 MPa
Squeegee speed: 60 mm/sec
Scraper speed: 50 mm/sec <Measurement and Evaluation of Firing Material Composition and Film-Shaped Firing Material>

The following items of the obtained firing material composition and the obtained film-shaped firing materials were measured and evaluated.

(Measurement of Thickness)

The thickness of the firing material composition and the thickness of the film-shaped firing material were measured using a constant pressure thickness-measuring device (product name: "PG-02", manufactured by Techlock, Inc.) in conformity with JIS K 7130. The results are listed in Table 1.

(Measurement of Viscosity)

The viscosity of the firing material composition was measured while the shear rate was changed from 0.1 $sec^{-1}$ to 10000 $sec^{-1}$ in a temperature environment of 23° C. using a dynamic viscoelasticity measuring device (MCR-302, manufactured by Anton Paar Japan K. K.). The viscosity (C) at a shear rate of 1 $sec^{-1}$ and the viscosity (D) at a shear rate of 1000 $sec^{-1}$ were read. The results are listed in Table 1.

(Measurement of Contact Angle)

One drop of the firing material composition was added dropwise onto the support (release film) in an environment of a temperature of 23° C. and a humidity of 50% RH, and the angle between the surface of the support and the tangent of the liquid droplet was measurement using a fully automatic contact angle meter (DM-701, manufactured by Kyowa Interface Science, Inc.). The results are listed in Table 1.

(Evaluation of Printability: Shape Maintainability)

Visual confirmation of whether the shape of the droplet immediately after the printing was held for approximately one minute immediately after the screen printing and before drying the composition was made, and the shape maintainability was evaluated based on the following evaluation standards. The results are listed in Table 1.

1: Wetting spread of the liquid (firing material composition) occurred immediately after the screen printing, and the size of the wetting spread thereof was large. Therefore, the shape immediately after the printing was not held at all.

2: The shape was held immediately after the screen printing, but wetting spread of the liquid gradually occurred, and the size of the wetting spread thereof was increased before the drying. Therefore, the shape immediately after the printing was not held.

3: The shape of the liquid was slightly changed immediately after the screen printing and immediately before drying of the composition, the change was not practically problematic.

4: The shape was not changed immediately after the screen printing and immediately before drying of the composition.

(Evaluation of Printability: Printing Property)

The plate separation of firing material composition from a screen plate after the screen printing was continuously performed five times and the surface state of the firing material composition immediately after the printing which had been transferred to the support were visually confirmed and evaluated based on the following evaluation standards. The results are listed in Table 1.

1: The plate separation was poor at the first printing, and thus the firing material composition remained on the screen plate. As a result, a required amount of the firing material composition was not able to be transferred to the support. Further, since the plate separation was poor and the transfer was insufficient, thickness unevenness was found to a degree that the unevenness was able to be visually confirmed from a portion where the printing was not performed and a portion where the printing was performed.

2: The plate separation was poor at the second printing, and thus the firing material composition remained on the screen plate. As a result, a required amount of the firing material composition was not able to be transferred to the support. Further, since the plate separation was poor and the transfer was insufficient, thickness unevenness was found to a degree that the unevenness was able to be visually confirmed from the surface state of the firing material composition immediately after the second printing.

3: The plate separation became slightly poor at the third or fourth printing, the firing material composition remained on the screen plate, but the surface state of the firing material composition immediately after the printing was satisfactory (uniform). The film-shaped firing material was at a practically acceptable level.

4: The plate separation was satisfactory even after the printing was continuously performed five times, and the surface state of the firing material composition immediately after the printing was satisfactory (uniform).

TABLE 1

|  |  |  | Example 1 | Example 2 | Example 3 | Example 4 |
|---|---|---|---|---|---|---|
| Firing material composition | Metal particle | Amount [% by mass] | 64 | 73 | 64 | 64 |
|  | Binder component | Amount [% by mass] | 11 | 12 | 11 | 11 |
|  | Solvent Dispersion medium | Relative evaporation rate | $1.1 \times 10^{-5}$/ $1.0 \times 10^{-3}$ | $1.1 \times 10^{-5}$/ $1.0 \times 10^{-3}$ | $1.1 \times 10^{-5}$/ $1.0 \times 10^{-3}$ | $1.1 \times 10^{-5}$/ $1.0 \times 10^{-3}$ |
|  |  | Amount [% by mass] | 11.3 | 12.9 | 11.3 | 11.3 |
|  | Diluent | Type | Butyl carbitol | Butyl carbitol | Propylene glycol monomethyl ether | Isobutyl acetate |
|  |  | Relative evaporation rate | 0.004 | 0.004 | 0.71 | 1.45 |

TABLE 1-continued

|  |  |  |  |  |  |  |
|---|---|---|---|---|---|---|
|  |  | Amount [% by mass] | 13.7 | 2.1 | 13.7 | 13.7 |
| Content of solvent (A) in firing material composition [% by mass] |  |  | 25 | 15 | 25 | 25 |
| Solid content concentration of firing material composition [% by mass] |  |  | 75 | 85 | 75 | 75 |
| Viscosity (C) [Pa·s] |  |  | 35 | 700 | 30 | 28 |
| Viscosity (D) [Pa·s] |  |  | 5 | 9 | 4 | 3.5 |
| Contact angle [°] |  |  | 50 | 50 | 45 | 40 |
| Average thickness of film-shaped firing material [μm] |  |  | 35 | 40 | 32 | 32 |
| Evaluation | Shape maintainability |  | 4 | 4 | 3 | 3 |
|  | Printing property |  | 4 | 3 | 3 | 3 |

|  |  |  |  | Comparative Example 1 | Comparative Example 2 | Comparative Example 3 |
|---|---|---|---|---|---|---|
| Firing material composition | Metal particle |  | Amount [% by mass] | 64 | 38 | 43 |
|  | Binder component |  | Amount [% by mass] | 11 | 7 | 48 |
|  | Solvent | Dispersion medium | Relative evaporation rate | $1.1 \times 10^{-5}/$ $1.0 \times 10^{-3}$ | $1.1 \times 10^{-5}/$ $1.0 \times 10^{-3}$ | $1.1 \times 10^{-5}/$ $1.0 \times 10^{-3}$ |
|  |  |  | Amount [% by mass] | 11.3 | 6.8 | 7.6 |
|  |  | Diluent | Type | Cyclohexane | Butyl carbitol | Butyl carbitol |
|  |  |  | Relative evaporation rate | 4.5 | 0.004 | 0.004 |
|  |  |  | Amount [% by mass] | 13.7 | 48.2 | 1.4 |
| Content of solvent (A) in firing material composition [% by mass] |  |  |  | 11.3 | 55 | 9 |
| Solid content concentration of firing material composition [% by mass] |  |  |  | 75 | 45 | 91 |
| Viscosity (C) [Pa·s] |  |  |  | 40 | 5 | 5000 |
| Viscosity (D) [Pa·s] |  |  |  | 5.5 | 0.1 | 100 |
| Contact angle [°] |  |  |  | 52 | 45 | 55 |
| Average thickness of film-shaped firing material [μm] |  |  |  | 37 | 8 | 45 |
| Evaluation | Shape maintainability |  |  | 4 | 1 | 4 |
|  | Printing property |  |  | 2 | 4 | 1 |

As shown in Table 1, the firing material compositions of Examples 1 to 4 had excellent printability and a circular film-shaped firing material was stably produced using each of the firing material compositions of Examples 1 to 4 as compared with the firing material compositions of Comparative Examples 1 to 3.

Each configuration in each embodiment and the combination thereof are merely examples, and additions, omissions, substitutions, and other modifications of configurations can be made within a range not departing from the scope of the present invention. Further, the present invention is not limited to the embodiments and only limited by the scope of the claims.

REFERENCE SIGNS LIST

1: film-shaped firing material
2: support sheet
3: base film
4: pressure-sensitive adhesive layer
5: ring frame
10: sinterable metal particles
20: binder component
100a: film-shaped firing material with a support sheet
100b: film-shaped firing material with a support sheet

The invention claimed is:

1. A paste-like firing material composition comprising:
sinterable metal particles;
a binder component;
a dispersion medium having a relative evaporation rate of $1.0 \times 10^{-5}$ to $1.0 \times 10^{-3}$ with respect to butyl acetate; and
a diluent solvent having a relative evaporation rate of 0.001 to 4.0 with respect to butyl acetate,
wherein a content of the sinterable metal particles is a range of in a range of 20% to 80% by mass with respect to a total mass of a solid content in the firing material composition,
wherein a content of the binder component is a range of 5% to 20% by mass with respect to the total mass of the solid content of the firing material composition,
wherein a content of dispersion medium is in a range of 10% to 20% by mass with respect to a total mass of the firing material composition,
wherein a content of the diluent solvent is in a range of 1% to 20% by mass with respect to the total mass of the firing material composition and
wherein a content of the dispersion medium and the diluent solvent is in a range of 15% to 40% by mass with respect to a total mass of the firing material composition,
wherein a viscosity of the firing material composition which is measured at a temperature of 23° C. and a shear rate of 1 sec$^{-1}$ is in a range of 25 to 800 Pa·s, and
a viscosity thereof which is measured at a temperature of 23° C. and a shear rate of 1000 sec$^{-1}$ is in a range of 1 to 10 Pa·s.

2. A method of producing a film-shaped firing material, comprising:
a step of screen-printing the firing material composition according to claim 1 on a support.

3. The method of producing a film-shaped firing material according to claim 2, wherein a contact angle between the firing material composition and the support is in a range of 20° to 60°.

4. The method of producing a film-shaped firing material according to claim 2,
wherein the firing material composition is screen-printed in a circular shape.

5. The method of producing a film-shaped firing material according to claim 4,
wherein an area of the film-shaped firing material is in a range of 3.5 to 1600 cm$^2$, and
a thickness thereof is in a range of 10 to 200 μm.

6. A method of producing a film-shaped firing material with a support sheet, comprising:
screen-printing the firing material composition according to claim 1 on a support to produce a film-shaped firing material,
peeling off the support from the film-shaped firing material, and
laminating a support sheet on the film-shaped firing material.

* * * * *